(12) United States Patent
Yamashita et al.

(10) Patent No.: US 7,568,922 B2
(45) Date of Patent: Aug. 4, 2009

(54) PRINTED WIRING BOARD HAVING A SOLDER PAD AND A METHOD FOR MANUFACTURING THE SAME

(75) Inventors: Takahiro Yamashita, Ogaki (JP); Hiroyuki Watanabe, Ogaki (JP); Kiyotaka Tsukada, Ogaki (JP); Michio Ido, Ogaki (JP); Morio Nakao, Shinjuku-ku (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 507 days.

(21) Appl. No.: 11/304,770

(22) Filed: Dec. 16, 2005

(65) Prior Publication Data

US 2006/0169484 A1    Aug. 3, 2006

(30) Foreign Application Priority Data

Dec. 17, 2004    (JP)    ............................. 2004-366287

(51) Int. Cl.
*H01R 12/00* (2006.01)
*H05K 1/00* (2006.01)

(52) U.S. Cl. ....................................................... 439/83

(58) Field of Classification Search .................. 439/83, 439/81, 82, 71, 74, 589; 174/254; 361/715; 438/108–109; 257/724, 737–738, 766
See application file for complete search history.

(56) References Cited

U.S. PATENT DOCUMENTS

| | | | |
|---|---|---|---|
| 6,239,386 B1 * | 5/2001 | DiStefano et al. ........... 174/262 |
| 6,274,820 B1 * | 8/2001 | DiStefano et al. ........... 174/254 |
| 6,313,529 B1 | 11/2001 | Yoshihara et al. |
| 6,504,105 B1 * | 1/2003 | Acocella et al. ............. 174/255 |
| 6,717,262 B1 | 4/2004 | Moriizumi et al. |
| 7,137,826 B2 * | 11/2006 | Brodsky et al. ............... 439/65 |
| 2006/0205273 A1 * | 9/2006 | Brodsky et al. ............. 439/589 |
| 2007/0010111 A1 * | 1/2007 | Brodsky et al. ............... 439/74 |

OTHER PUBLICATIONS

Patent Abtracts of Japan, JP 2002-190490, Jul. 5, 2002.
Patent Abstracts of Japan, JP 2001-223460, Aug. 17, 2001(corresponding US 6,717,262 B1).
Patent Abstracts of Japan, JP 11-067820, Mar. 9, 1999 (corresponding US 6,313,529 B1).

* cited by examiner

*Primary Examiner*—Chandrika Prasad
(74) *Attorney, Agent, or Firm*—Oblon, Spivak, McClelland, Maier & Neustadt, P.C.

(57) ABSTRACT

This invention provides a printed wiring board having an intensified drop impact resistance of a joint portion between pad and solder. An electrode pad comprises pad portion loaded with solder ball and a cylindrical portion projecting to the solder ball supporting the pad portion. An outer edge of the pad portion extends sideway from a cylindrical portion so that the outer edge is capable of bending. If the outer edge bends when stress is applied to the solder ball 30, stress on the outer edge of the pad portion on which stress is concentrated can be relaxed so as to intensify the joint strength between an electrode pad and solder ball.

17 Claims, 19 Drawing Sheets

Fig. 5
(A)
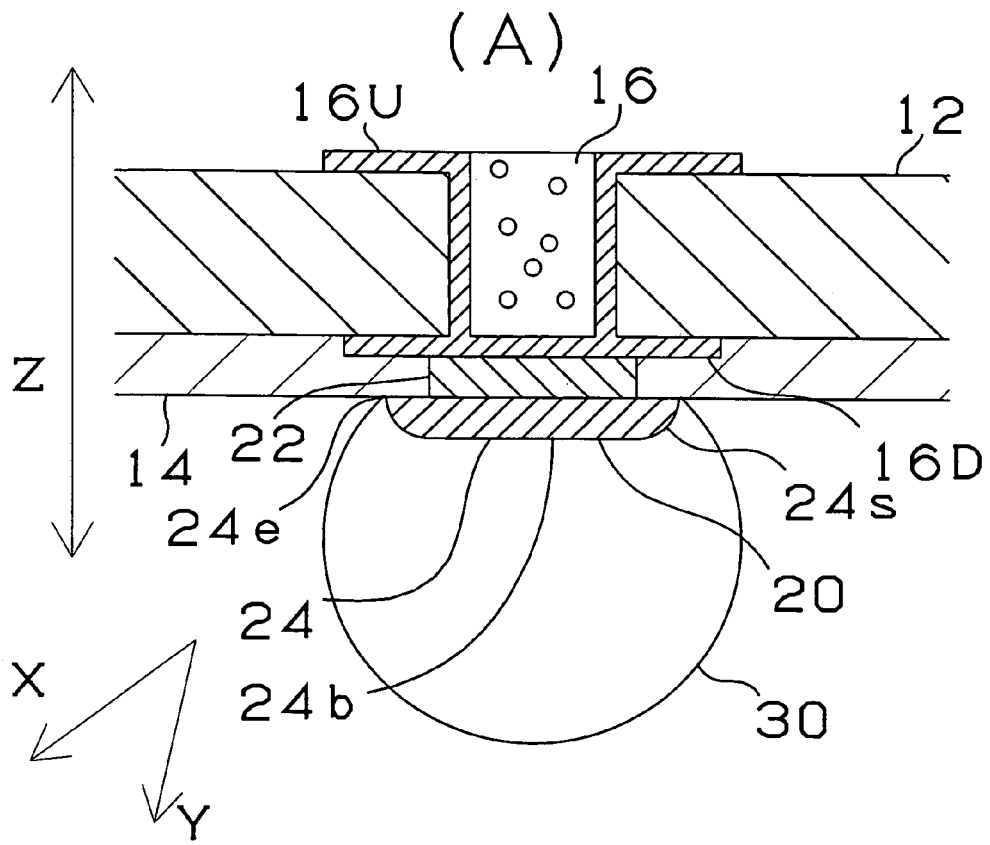
(B)
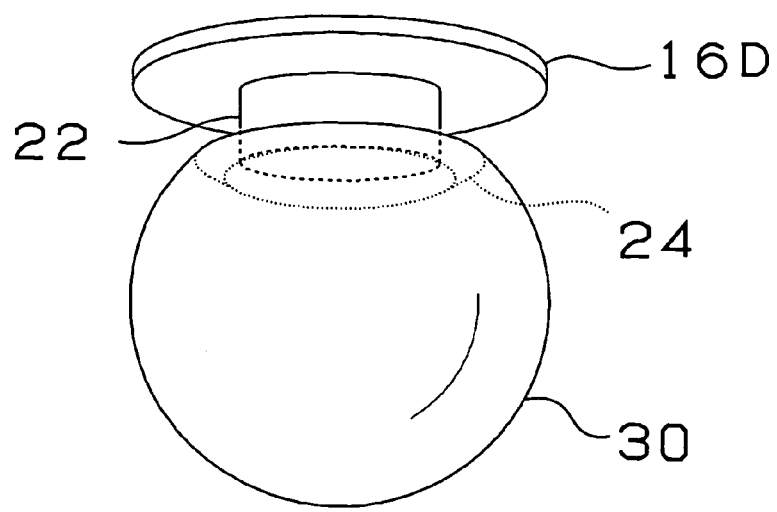

Fig.6
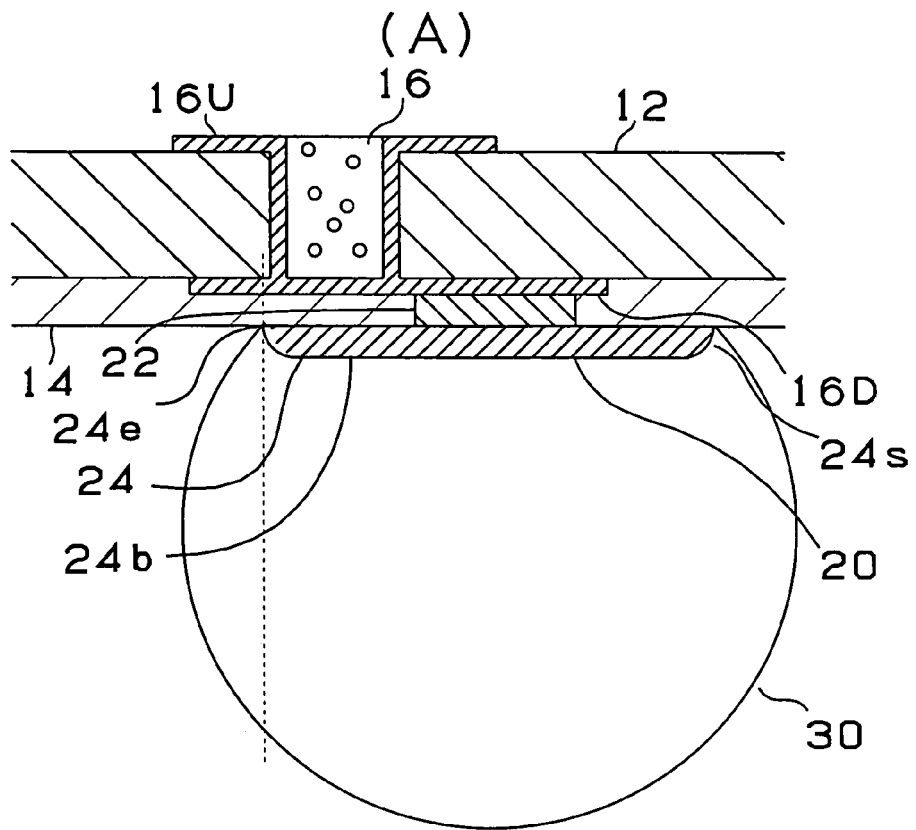
(A)
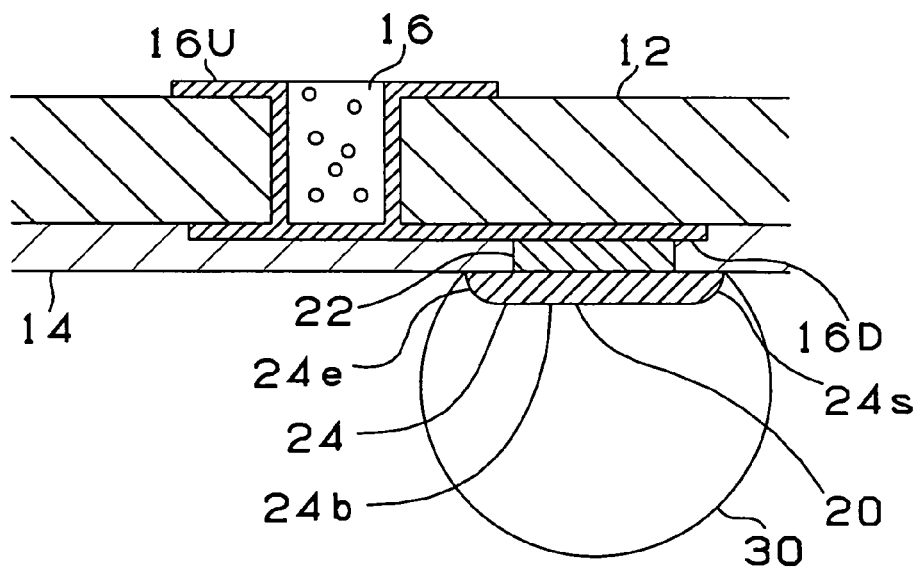
(B)

Fig.7
(A)
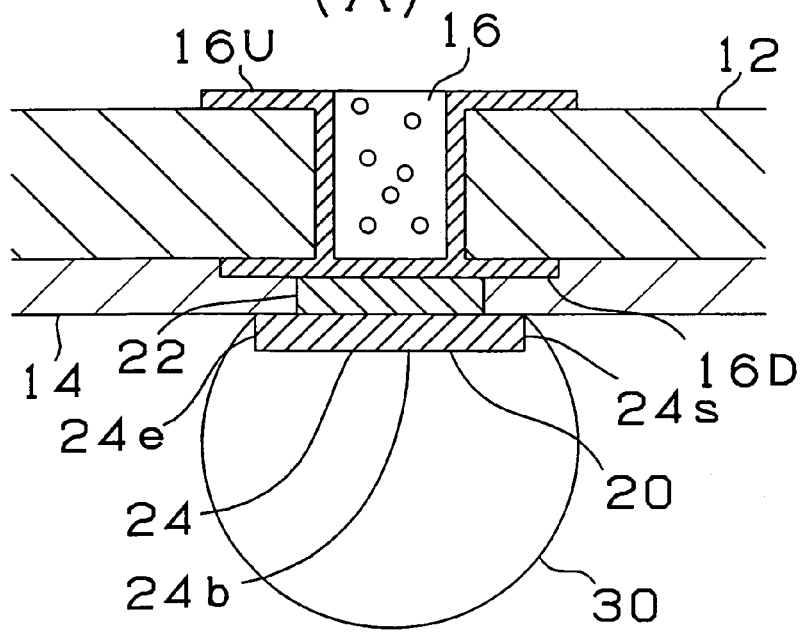
(B)
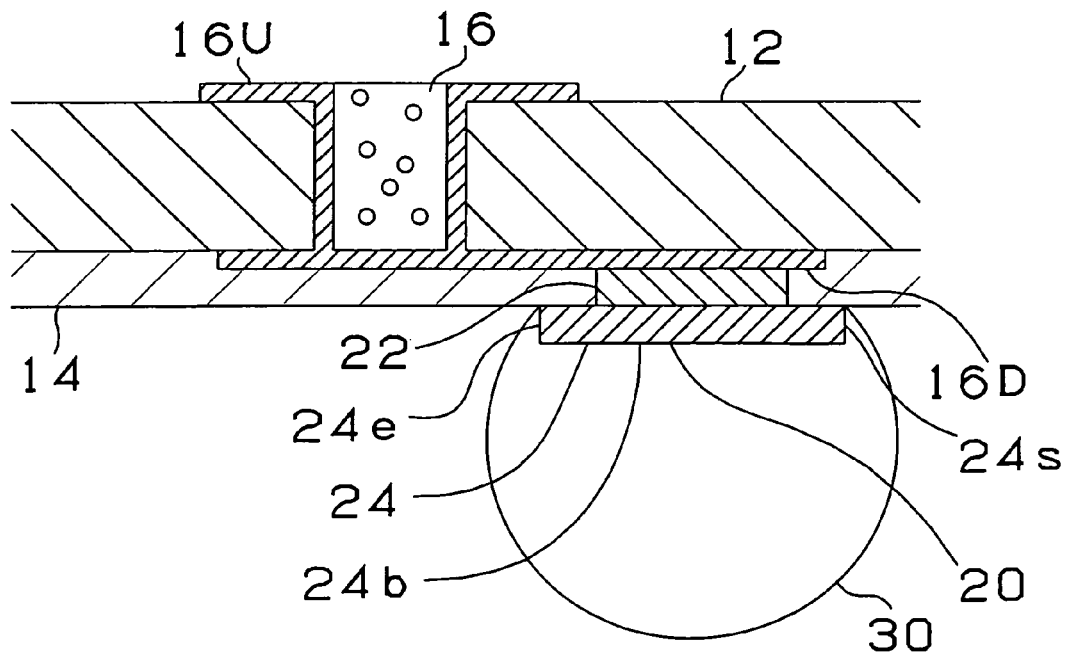

Fig.8
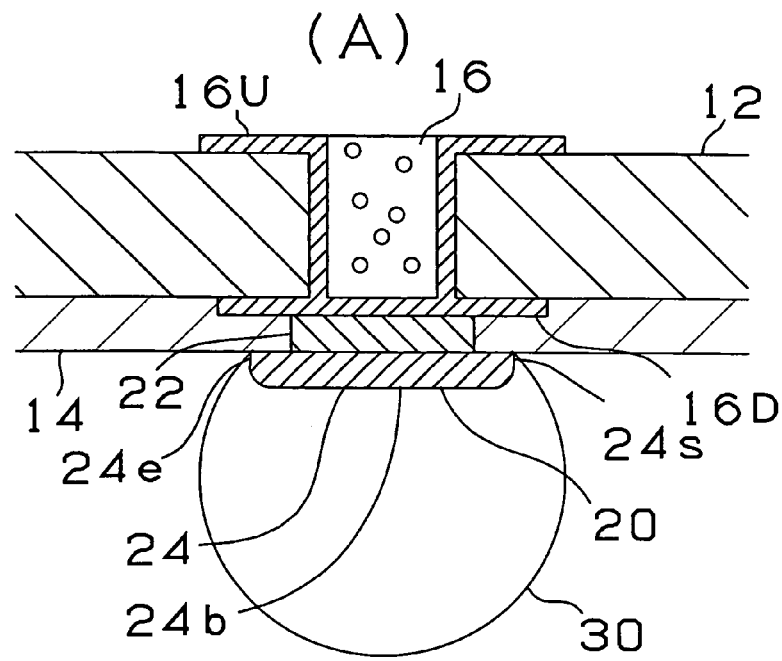
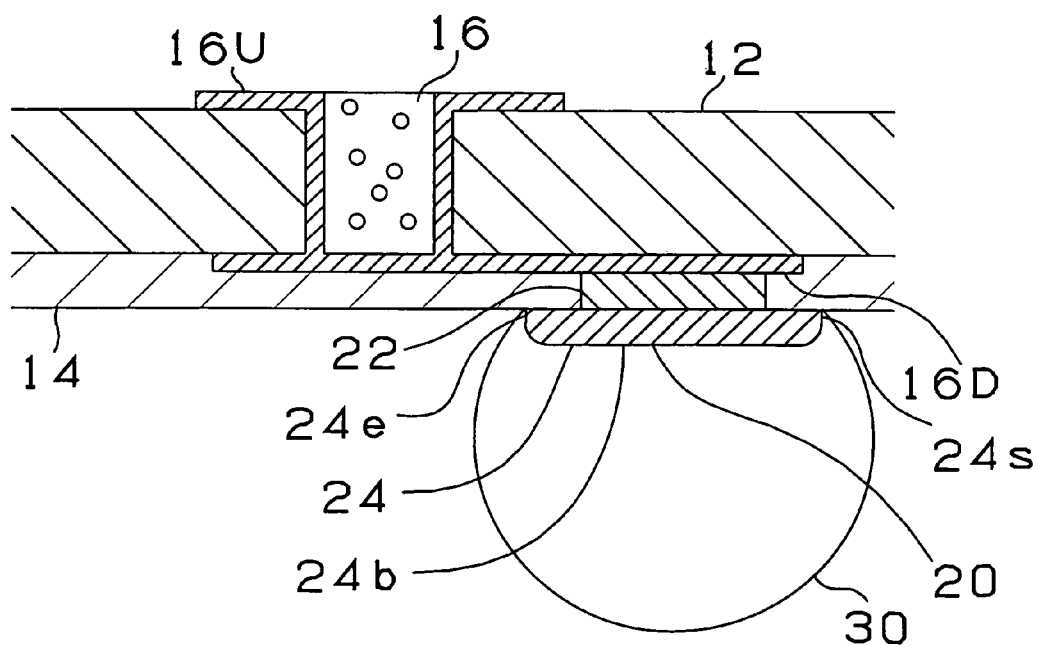

Fig.10
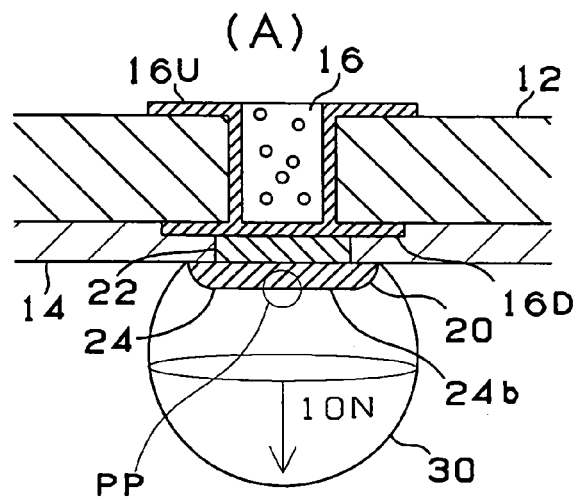
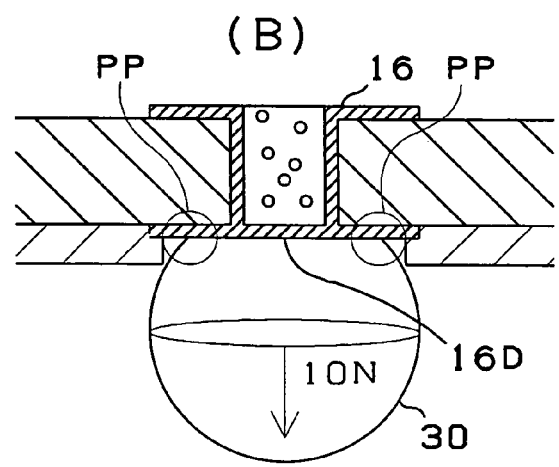
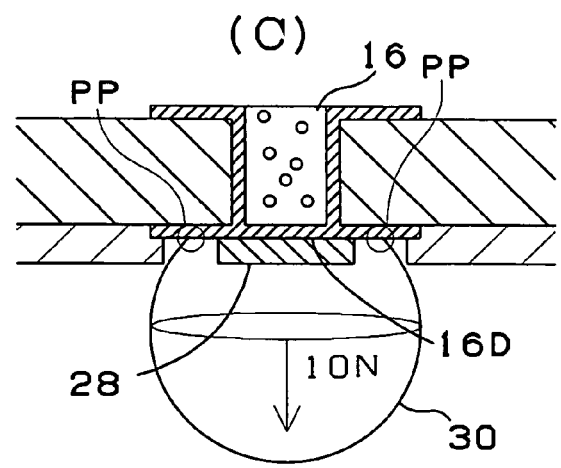

Fig.11
(A)
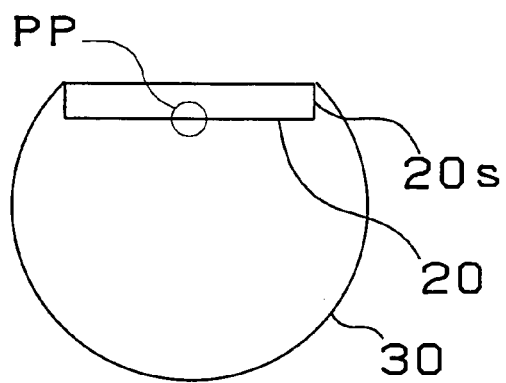
(B)
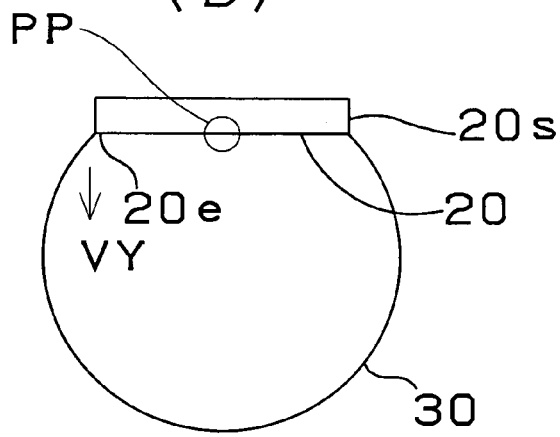
(C)
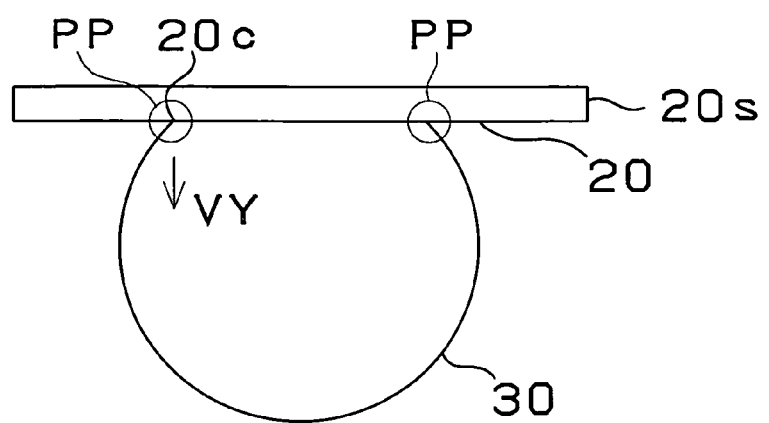

|  | UY Displacement | Central Portion Stress | End Portion Stress |
|---|---|---|---|
| 82FIXED | 0.66 μm | 355MPa | 36MPa |
| 81FIXED | 0.71 μm | 359MPa | 29MPa |
| 80FIXED | 0.75 μm | 362MPa | 23MPa |
| 79FIXED | 0.79 μm | 367MPa | 18MPa |
| 78FIXED | 0.84 μm | 371MPa | 15MPa |

(B)

|  | 1 | 2 | 3 | 4 | 5 |
|---|---|---|---|---|---|
| PAD Diameter | 260 | 290 | 320 | | |
| Opening Diameter | 120 | 130 | 140 | | |
| Pad Portion Diameter | 180 | 190 | 200 | 180 | 220 |
| PAD Portion Thickness | 30 | | | 20 | 40 |
| R | | | | | |

Fig.15
(A)
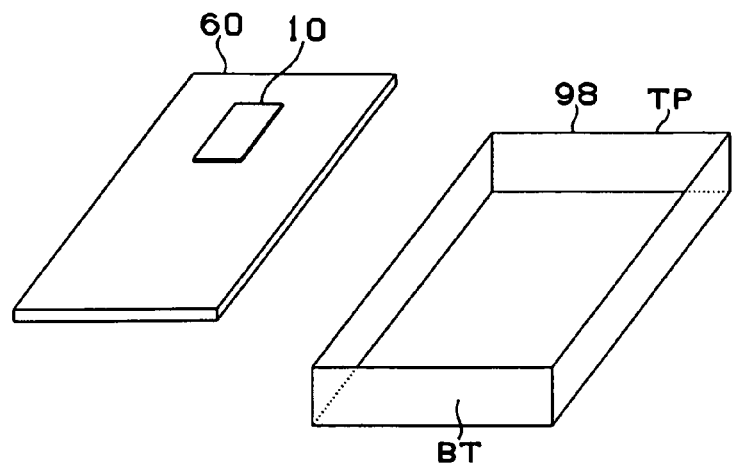
(B)
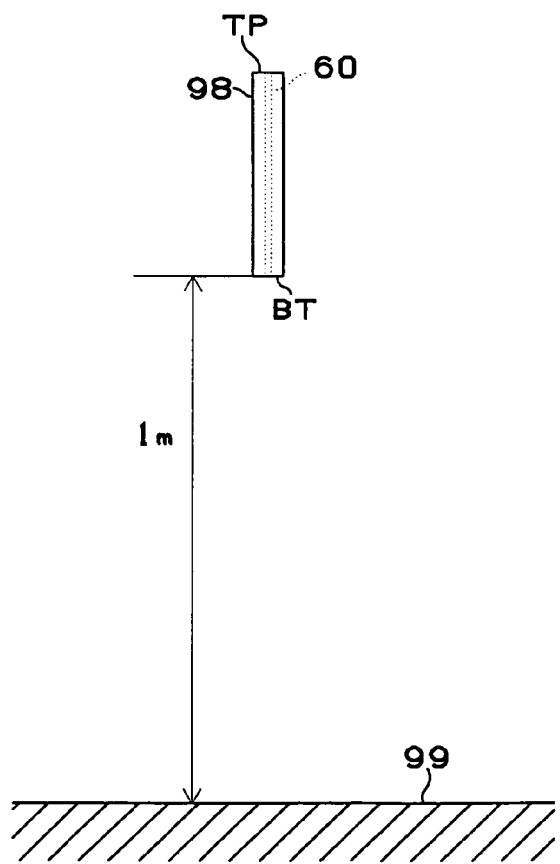

Fig. 16

Evaluation Result

| Item | Drop Test | | | Reliability Test (Cycle Counts) | | |
|---|---|---|---|---|---|---|
| | 10 Times | 20 Times | 30 Times | 1000 | 2000 | 2000 |
| Embodiment1-1 | ○ | ○ | ○ | ○ | ○ | ○ |
| Embodiment1-2 | ○ | ○ | ○ | ○ | ○ | △ |
| Embodiment1-3 | ○ | ○ | ○ | ○ | ○ | △ |
| Embodiment1-4 | ○ | ○ | × | ○ | ○ | × |
| Embodiment1-5 | ○ | ○ | ○ | ○ | ○ | △ |
| Embodiment1-6 | ○ | ○ | ○ | ○ | ○ | △ |
| Embodiment1-7 | ○ | ○ | ○ | ○ | ○ | △ |
| Embodiment1-8 | ○ | ○ | ○ | ○ | ○ | ○ |
| Embodiment1-9 | ○ | ○ | ○ | ○ | ○ | ○ |
| Embodiment1-10 | ○ | ○ | ○ | ○ | ○ | ○ |
| Comparative Embodiment 1-1 | × | × | × | △ | × | × |
| Comparative Embodiment 1-2 | × | × | × | × | × | × |

Fig.17
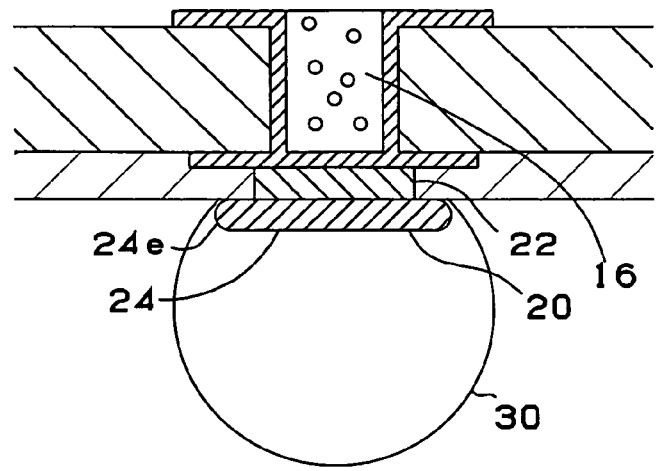
(A)
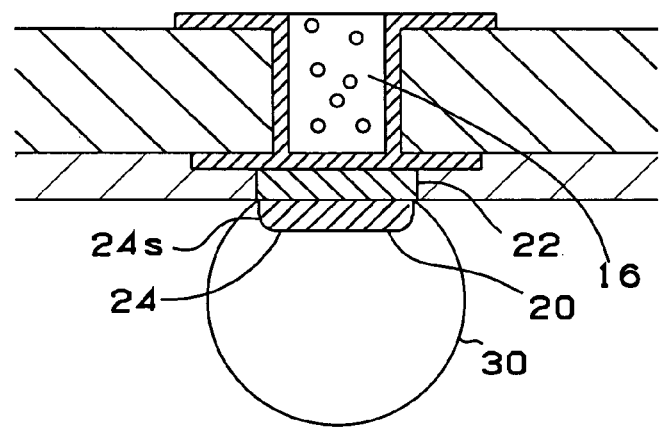
(B)
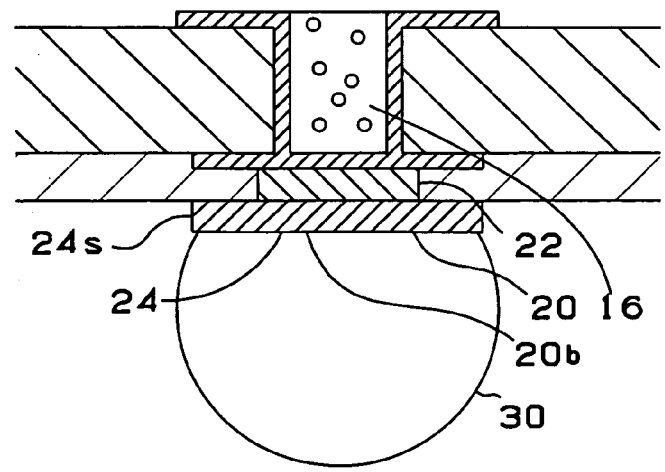
(C)

Fig.18
(A)
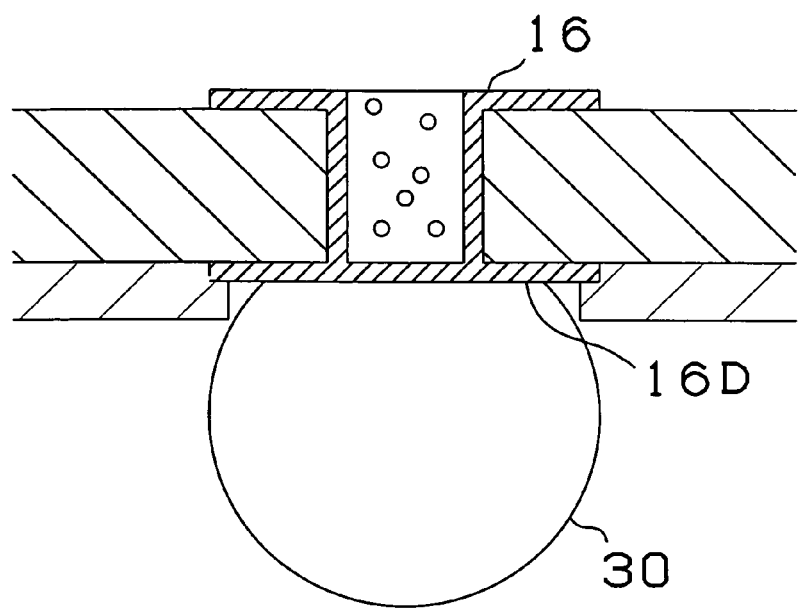
(B)
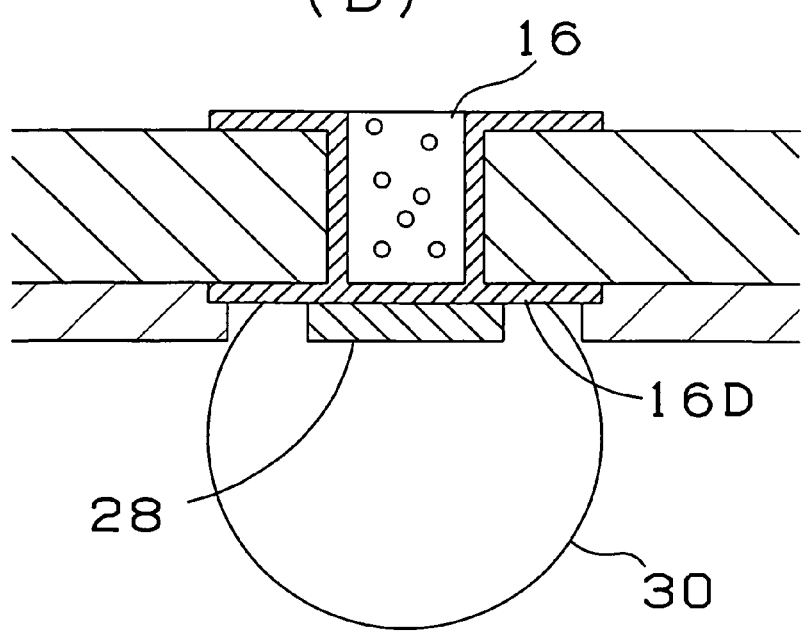

Fig.19
(A)
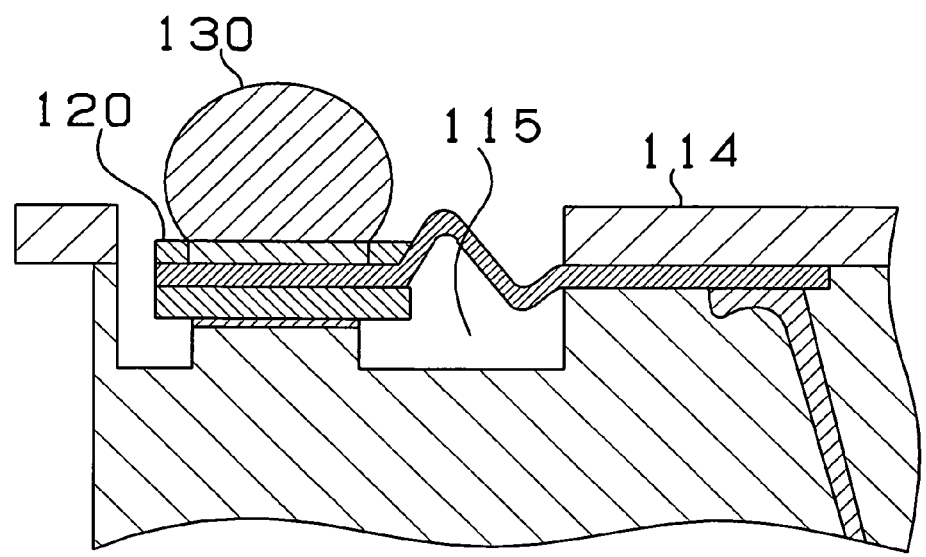
(B)
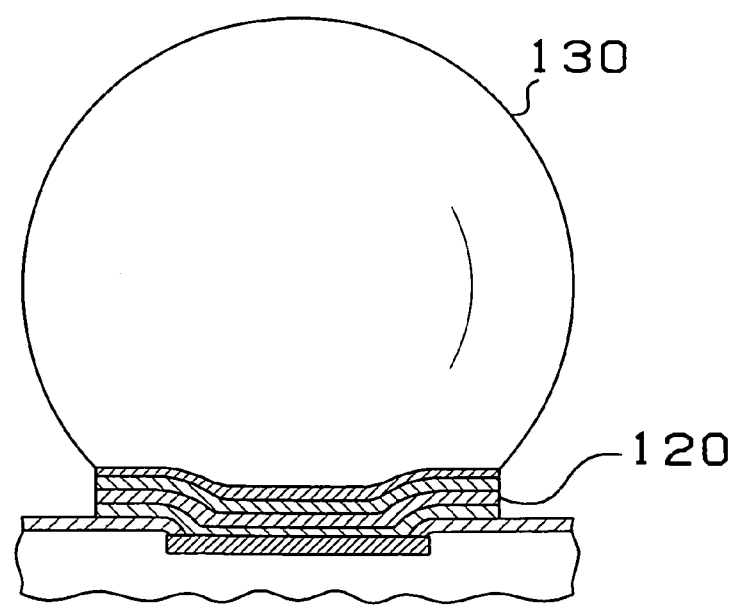

PRINTED WIRING BOARD HAVING A SOLDER PAD AND A METHOD FOR MANUFACTURING THE SAME

BACKGROUND OF THE INVENTION

1. Field of the Invention

The present invention relates to a printed wiring board having solder pads on which solder balls, solder bumps or solder layers are to be loaded and more particularly to the printed wiring board suitable for IC chip mount substrate to be mounted with a semiconductor device.

2. Description of the Related Art

The substrate for mounting IC chip sometimes need to be mounted with not only a single IC chip but also other electronic components such as capacitor and resistor or an IC chip having other function depending on a case. For the reason, a plurality of electrodes (hereinafter referred to as solder pad) is formed at a high density on the board and solder bumps are provided on the solder pad which is a mounting surface and flip-chip mounting is connected through the solder bumps. The substrate for mounting IC chip is connected to the printed wiring board on which it is connected through solders provided on the pad. A component is mounted by reflowing solder layer formed on the solder pad.

JP2001-143491 A has disclosed technology about providing a mounting pad projecting from a substrate surface on the outermost layer of the package board. JP 2003-198068 A has disclosed technology about exposing part of an electrode pad 120 through a gap portion 115 provided in an insulating layer 115 as shown in FIG. 19(A). JP2004-6872 A has disclosed technology about providing the pad 120 with stress absorbability by forming the pad 120 to be equipped with the solder ball 130 into a concave shape as shown in FIG. 19(B). U.S. Pat. No. 6,400,018 B2 has disclosed technology about forming the pad shape into a curve.

The solder layer is formed on the solder pad by these technologies

According to a first aspect of the present invention, there is provided a printed wiring board having solder pads loaded with solder for mounting an electronic part or an outside board, wherein the solder pad comprises a surface pad portion loaded with solder and a column portion projecting to the solder supporting the surface pad portion. The surface pad portion is constituted in a diameter larger than the column portion or the surface pad portion is in contact with the solder through its bottom face and side face.

In the printed wiring board of the present invention, the solder pad is comprised of the pad portion loaded with the solder ball and the column-like portion projecting to the side of the solder (which means solder ball, solder bump, solder column (including external connection terminals such as PGA, BGA)) and the pad portion is constituted in a larger diameter than the column-like portion. That is, an outer edge of the pad portion extends sideway from the column-like portion so that the outer edge can bend.

Solder on the solder pad is connected to an electronic component, the IC chip or an outside board. When stress is applied to solder by heat or the like on the side to which these are connected, the outer edge bends thereby preventing stress from being applied to the outer edge of a surface pad portion to which stress is concentrated easily and consequently, stress can be relaxed so that the joining strength between the solder pad and solder can be prevented from dropping.

Because the surface pad portion makes contact with the solder through its bottom face and side face so that the contact area of the conductive portion is larger than when in contact through only the bottom face, stress per unit area applied to the joint portion between the surface pad portion and solder can be reduced. As a result, the joining strength between the solder pad and solder can be obtained more easily than in a conventional solder pad structure. The drop impact resistance of the joint portion between the solder pad and solder can be obtained.

According to a second aspect of the present invention, the solder pad of the present invention is formed on through hole. Consequently, the conductive portion in the Z-axis direction of the substrate extends so as to relax stress on the solder pad and through hole and the joining strength between the solder pad and solder ball is unlikely to decline. Further, stress to stress by drop becomes unlikely to be concentrated at the conductive portion of the through hole also. Thus, the drop impact resistance of the joining portion between the solder pad and solder can be obtained.

It has been recognized that when this through hole is located just below the surface pad which is the solder pad, the above-described effect is provided. That is, when the outer edge of the through hole is located inside the outer edge of the surface pad, the above-described effect is exerted. Although the through hole is hollow in this case, it may be solid. Any structure secures the same effect.

According to a third aspect of the present invention, the corners of the bottom face and side face of the pad portion are chamfered into a round face. Consequently, concentration of stress in the vicinity of the corner of the pad portion is eliminated so that stress applied to the surface pad portion becomes likely to be equalized. Thus, the joining strength between the surface pad and solder is unlikely to drop thereby unlikely inducing a fault such as crack or the like in the solder pad portion.

Because stress is unlikely to be concentrated in the vicinity of the corner, stress to stress by drop in a drop test or the like is not concentrated locally and thus any fault such as crack is unlikely to occur. Thus, the drop impact resistance of the joining portion between the solder pad and solder becomes unlikely to drop.

According to a fourth aspect of the present invention, the side face of the pad portion is formed circularly at 90°. Consequently, concentration of stress in the vicinity of the corner of the pad portion is eliminated, so that stress applied to the surface pad portion is likely to be equalized. Thus, the joining strength between the surface pad and solder is unlikely to drop thereby unlikely inducing any fault such as crack in the solder pad portion.

Because stress is unlikely to be concentrated in the vicinity of the corner, stress to stress by drop in a drop test or the like is not concentrated locally thereby unlikely inducing any fault such as crack. Thus, the drop impact resistance of the joining portion between the solder pad and solder is unlikely to decline.

According to a fifth aspect of the present invention, preferably, the column portion is cylindrical, cylindrical with inside vacancy, square, rectangular, polygonal. These shapes allow stress to be relaxed and do not drop the electric characteristic (increase in electric resistance and the like).

Particularly, it is preferred to be cylindrical, cylindrical with inside vacancy or polygonal shape having more corners than hexagon. The corner disappears or the angle of the corner is increased (or blunt angle) by these shapes so that stress is unlikely to be concentrated by these shapes thereby likely dispersing buffered stress (thermal stress, stress by drop). Thus, any fault such as crack or the like in the conductor in the vicinity of the solder pad can be prevented.

The metal layer which constitutes the solder pad can be formed by plating, sputtering or the like. It is permissible to use any of these metal layers or laminate these metal layers into multiple layers of two or more. As these metals, it is permissible to use metal having conductivity such as copper, nickel, phosphor, titan, precious metal.

Metal which constitutes the column-like portion of the solder pad can be formed by plating, sputtering, conductive paste or the like. These metals may be used in a single layer or laminated into multiple layers of two or more. The column-like portion may be filled with metal or hollow (mainly a central portion is hollow).

To form the solder pad, it is permissible to use wiring formation method for apply in a printed wiring board such as an additive method and a subtractive method or the like.

As the solder for apply in the present invention, it is permissible to use two-component solder, three-component solder or multi-component solder higher than four components. As metal contained in these composition, it is permissible to use Sn, Ag, Cu, Pb, Sb, Bi, Zn, In or the like.

The two-component solder includes Sn/Pb, Sn/Sb, Sn/Ag, Sn/Cu, Sn/Zn and the like. The three-component solder includes Sn/Ag/Cu, Sn/Ag/Sb, Sn/Cu/Pb, Sn/Sb/Cu, Sn/Ag/In, Sn/Sb/In, Sn/Ag/Bi, Sn/Sb/Bi and the like. As these three-component solder, three components may be contained by more than 10 wt % or main two components may occupy more than 95 wt % while the other may be of one component (for embodiment, total of Sn and Ag is 97.5 wt % and the remainder is Cu). Additionally, it is permissible to use multi-component solder higher than four components. The multi-component solder includes Sn/Ag/Cu/Sb, Sn/Ag/Cu/Bi and the like. It is permissible to apply solder whose alpha (a) dose is adjusted.

If solder containing lead (for embodiment, Sn/Pd=6/4) is used on the solder pad of the present invention, stress can be buffered by lead in the solder so that stress can be buffered easily. Consequently, the joining strength on the solder pad becomes unlikely to drop thereby unlikely inducing any fault such as crack or the like.

On the other hand, if solder free of lead (for embodiment, Sn/Ag/Cu=65/32.5/2.5) is used, stress in the solder is more difficult to buffer than when the solder containing lead is used. This reason is that the metal used as the solder does not buffer stress easily. However, even if solder free of lead is applied, the present invention allows stress to be buffered by the solder pad and consequently, the joining strength at the solder pad is difficult to decline thereby unlikely inducing any fault such as crack or the like.

According to the present invention, the joining strength between the solder pad and solder is obtained so that stress by drop and thermal stress can be buffered by the solder and consequently, the reliability and drop impact resistance can be obtained than the conventional solder pad structure. Thus, the electric connectivity and connection reliability become unlikely to drop. Consequently, the performance of an electronic appliance incorporating the printed wiring board can be maintained in a long period.

By disposing the through hole in the solder pad portion or providing the surface pad portion with a round face, the reliability and drop impact resistance become unlikely to drop and consequently, the function of the electronic appliance possibly maintains in a long period.

As the electronic appliance, the present invention is preferred to be applied in a portable electronic appliance. The portable electronic appliance includes portable phone, portable computer, portable terminal (including game machine) and the like. These appliances are demanded to have reliability with a progress of function. The portable electronic appliances are estimated to be dropped by mistake and thus, are demanded to have a structure capable of securing reliability easily.

BRIEF DESCRIPTION OF THE DRAWINGS

FIG. 5(A) is a sectional view showing an electrode pad of embodiment 1-1 and FIG. 5(B) is a perspective view of the electrode pad;

FIG. 6(A) is a sectional view showing an electrode pad according to a modification of the embodiment 1-1 in enlargement and FIG. 6(B) is a sectional view showing an electrode pad according to the embodiment 1-2 in enlargement;

FIG. 7(A) is a sectional view showing an electrode pad according to the embodiment 1-3 in enlargement and FIG. 7(B) is a sectional view showing an electrode pad according to the embodiment 1-4 in enlargement;

FIG. 8(A) is a sectional view showing an electrode pad according to the embodiment 1-5 in enlargement and FIG. 8(B) is a sectional view showing an electrode pad according to the embodiment 1-6 in enlargement;

FIG. 10(A) is a schematic diagram showing a stress maximum point of the electrode pad according to the embodiment 1-1, FIG. 10(B) is a schematic diagram showing a stress maximum point of the electrode pad of prior art (comparative embodiment 1-1), FIG. 10(C) is a schematic diagram showing a stress maximum point of the electrode pad according to the comparative embodiment 1-2;

FIGS. 11(A), 11(B), 11(C) are schematic diagrams showing a simulation model used for stress analysis;

FIG. 13 is a schematic diagram showing a simulation model used for stress analysis;

FIG. 13(A) is a Table showing a simulation result and FIG. 13(B) is a Table showing dimensions of each portion of the electrode pad;

FIG. 15 is a schematic diagram showing a method of drop test;

FIG. 16 is a Table showing a result of drop test and reliability test;

FIG. 17(A) is a sectional view showing an electrode pad according to a second embodiment in enlargement, FIG.

17(B) is a sectional view showing an electrode pad according to a third embodiment in enlargement, FIG. 17(C) is a sectional view showing an electrode pad according to a fourth embodiment;

FIG. 18(A) is a sectional view showing an electrode pad according to the comparative embodiment in enlargement and FIG. 18(B) is a sectional view showing an electrode pad according to the comparative embodiment in enlargement; and FIG. 19(A) is an explanatory diagram of a solder pad structure of a related art and FIG. 19(B) is an explanatory diagram of the solder pad structure of a related art.

DESCRIPTION OF THE PREFERRED EMBODIMENTS

First Embodiment

The embodiment 1 that a printed wiring board of the present invention is applied to a package board will be described with reference to FIGS. 1-2.

Figure 1:
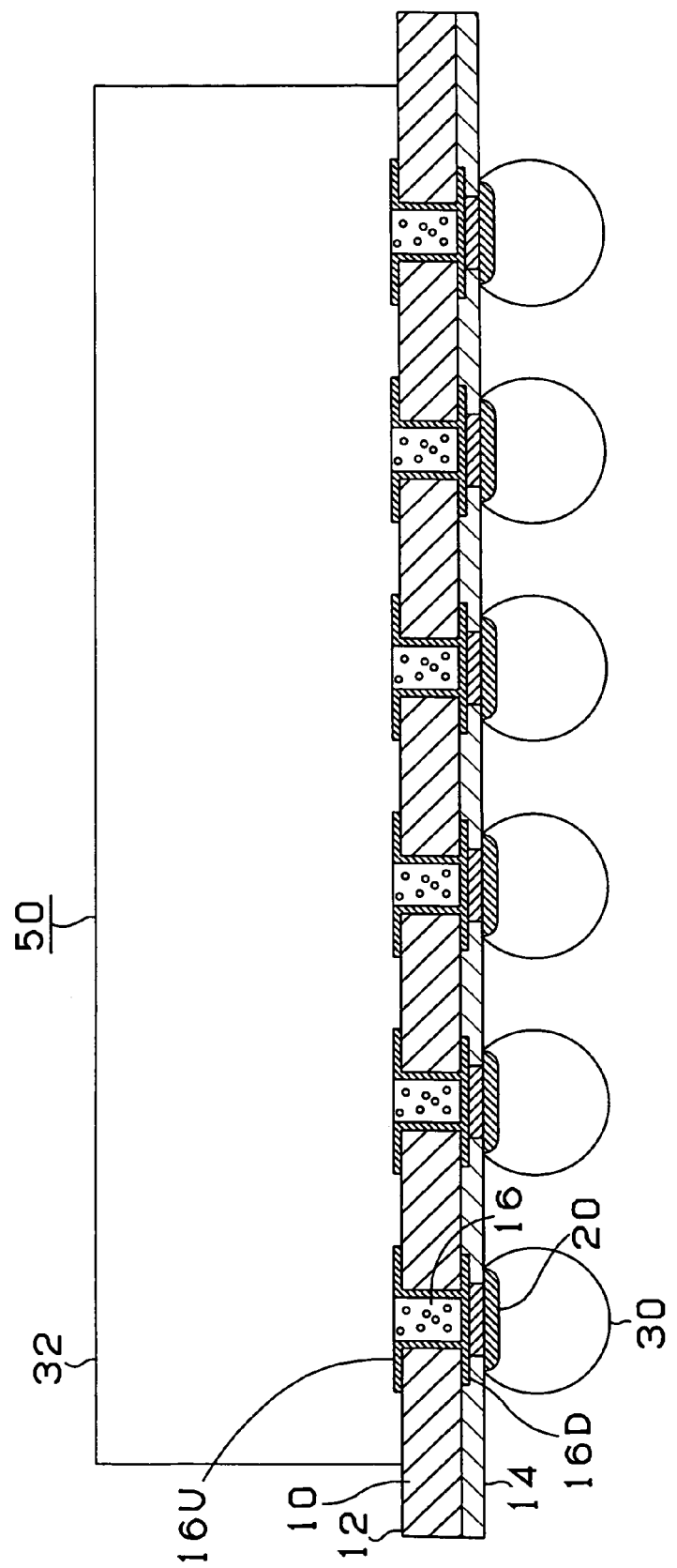
FIG. 1 is a sectional view showing the structure of a package board according to an embodiment of the present invention.
Figure 2:
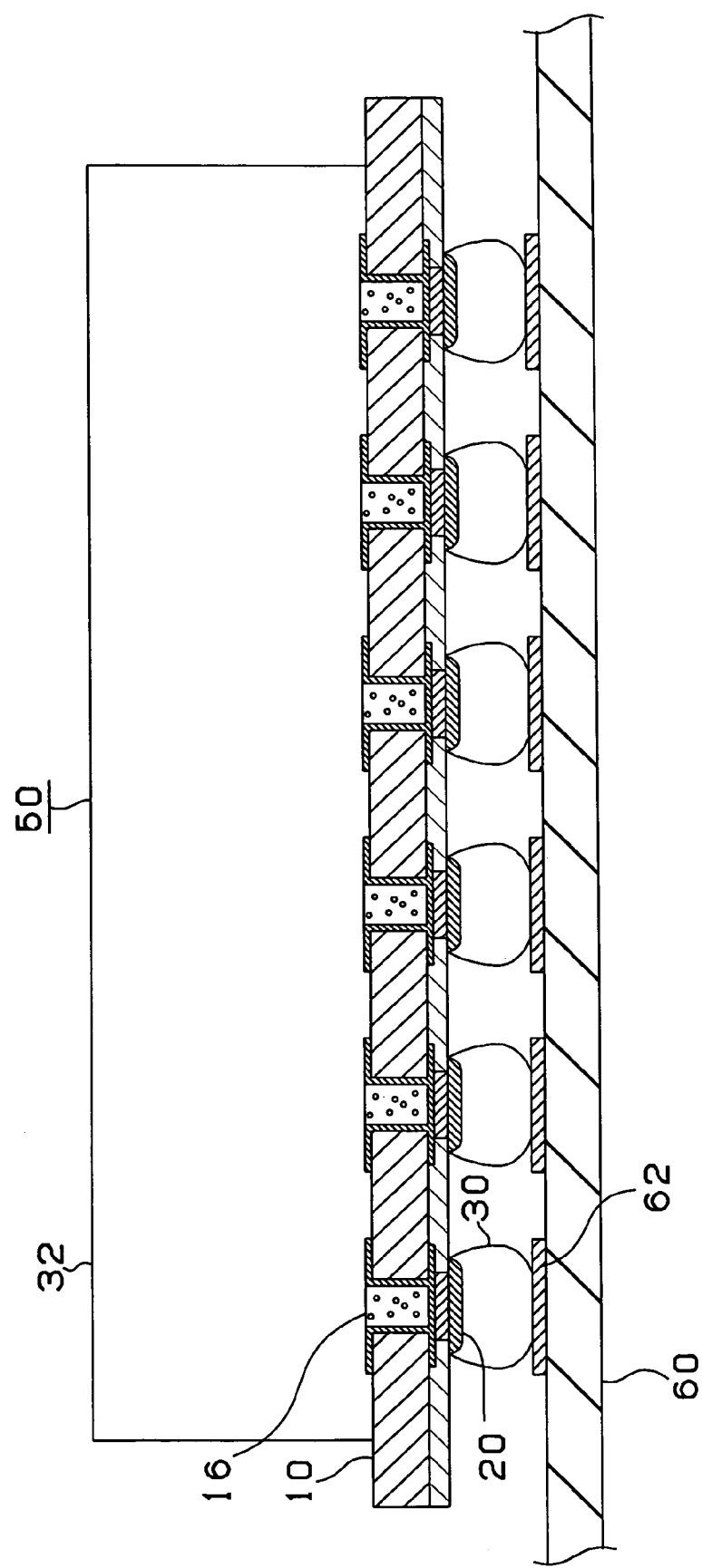
FIG. 2 is a sectional view showing a condition in which the package board shown in FIG. 1 is mounted on a mounting object printed wiring board.

FIG. 1 is a sectional view of a semiconductor device using the package board of the embodiment 1 and FIG. 2 is a sectional view showing a condition in which the semiconductor device shown in FIG. 1 is mounted on a mounting object printed wiring board.

As shown in FIG. 1, a semiconductor device (IC) 50 includes a package board 10 and a mold resin 32 (not shown) for sealing the IC chip. The board mounting for IC chip 10 is comprised of a resin substrate 12 which is hardened by impregnating glass cloth composed of glass epoxy or the like with epoxy resin, through holes 16 for connecting the top and bottom faces of the resin substrate 12, a solder resist layer 14 provided on the bottom face of the resin substrate 12, a solder pad 20 provided on the bottom face of the through hole 16, and a solder ball 30 connected to the solder pad 20. A land 16U and a land 16D are formed on the top face and the bottom face of the through hole 16 respectively. The IC chip is connected to the land 16U on the top face by bonding wire (not shown).

Manufacturing of such an embodiment is carried out through following steps.

Figure 3:
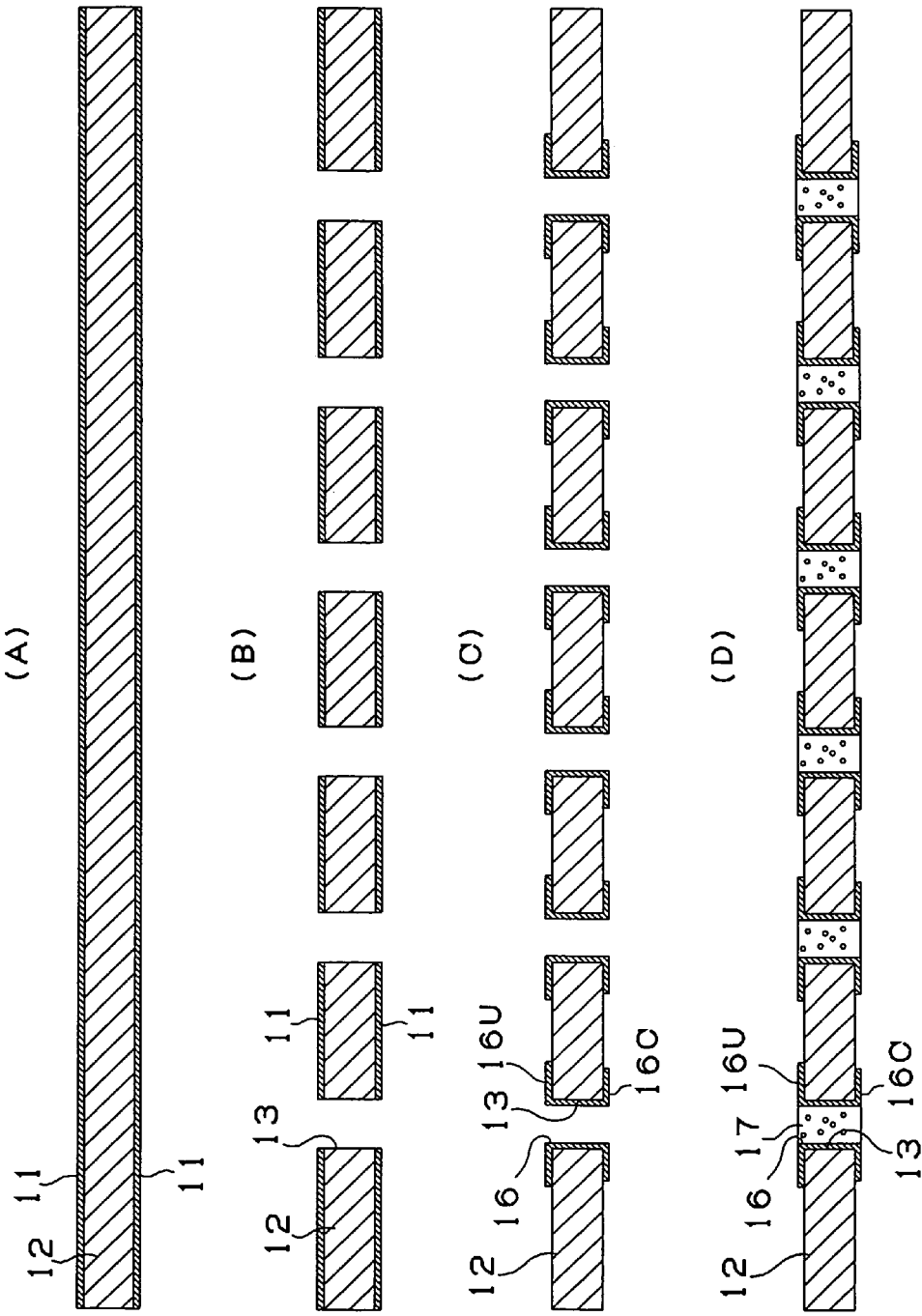
FIG. 3 is a process diagram showing a manufacturing method of the package board shown in FIG. 1.

(1) Through holes 13 are formed by using drills or the like in double sided copper-clad lamination board (manufacturer: Matsushita Electric Works Engineering Co., Ltd., product No.: halogen free epoxy multi R1566 or the like) produced by laying copper foil 11 on a substrate 12 as shown in FIG. 3(A) (FIG. 3(B)). After plating in this through hole 13 (electrolytic plating or nonelectrolytic plating), a pattern is formed with resist so as to form the through holes 13 which enable electric connection and conductor circuit (land) 16U, 16C on the surfaces (FIG. 3(C)).

Figure 4:
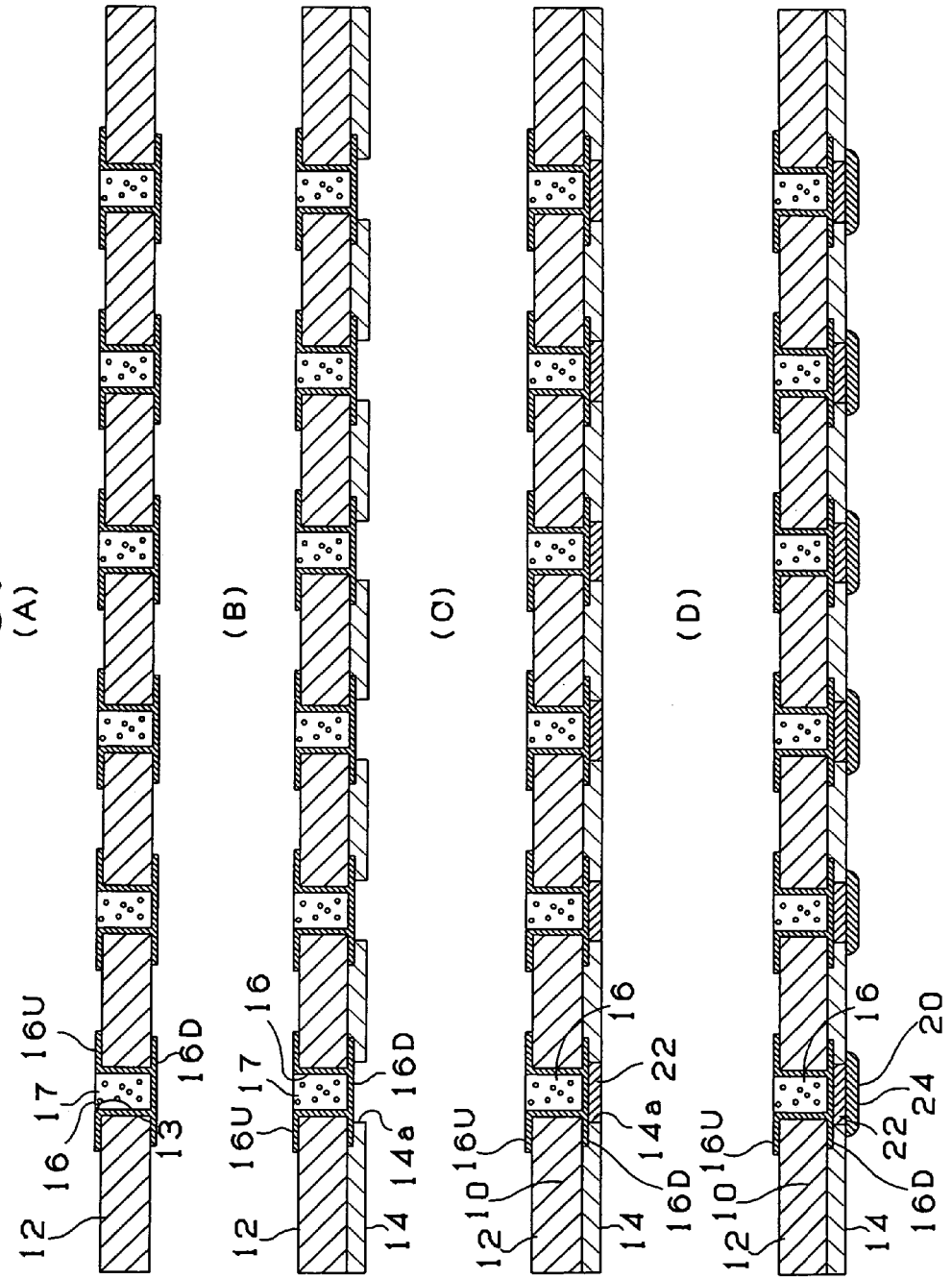
FIG. 4 is a process diagram showing a manufacturing method of the package board shown in FIG. 1.

(2) The through holes 13 are filled with resin 17 having insulation property such as epoxy resin by printing or the like. After that, a process for semi-hardening (for embodiment, heating at 100° C. for 30 minutes) which allows polishing is carried out and polishing process by buffing or with abrasive paper and complete hardening process are executed to obtain a printed wiring board in which insulating resin 17 is applied in the through holes 13 (FIG. 3(D)). Conductive layer (land) 16D is formed by plating or the like on the through hole 13 (FIG. 4(A)).

(3) Resin layer such as a solder resist layer is formed on the face on which the conductive layer 16D is formed. An opening 14a is provided in the resin layer 14 by exposure/development or with a laser beam (FIG. 4(B). An inside of the opening 14a is filled with plating or conductive paste mixed with conductive particles such as copper. Consequently, a column portion 22 of solder pad is formed (FIG. 4(C)).

(4) The entire surface of the substrate is plated and after that, a pattern is formed. A solder pad 20 is completed by forming a surface pad 24 through etching process (FIG. 4(D)).

As shown in FIG. 2, a semiconductor device 50 is mounted on a mounting object printed wiring board 60 by connecting solder balls 30 to pads 62 provided on the mounting object printed wiring board 60.

Although the embodiment shown in FIGS. 1 and 2 indicates two layers, it is permissible to use a lamination having three or more layers as a printed wiring board and as its lamination method, it is permissible to use a generally used method for the printed wiring board, such as an additive method and a subtractive method or the like.

Although the base material of the printed wiring board for apply is produced by impregnating glass cloth with epoxy resin, it is permissible to use thermosetting resin, thermoplastic resin, photosensitive resin or a mixture of two or more kinds of these resins. Its specific embodiments include FR-4 and FR-5.

Embodiment 1-1

FIG. 5(A) is a sectional view showing the solder pad 20 of an board mounting for IC chip in enlargement and FIG. 5(B) is a perspective view thereof.

The solder pad 20 is comprised of mainly a surface pad portion 24 for carrying a solder ball 30 composed of solder and a column-like portion 22 (cylinder) projecting to the side of the solder ball while supporting the pad portion 24. The surface pad portion 24 is constituted in a larger diameter than the column-like portion 22 and that is, an outer edge 24e of the surface pad 24 extends sideway from the column-like portion 22 and the outer edge 24e is capable of bending. When a stress (thermal stress, stress by drop) is applied to the solder ball 30 from outside, the outer edge 24e bends so as to relax the stress on the outer edge 24e of the surface pad portion 24 on which stress is likely to be concentrated, thereby making it difficult for bonding strength between the solder pad 20 and the solder ball 30 to drop.

The surface pad portion 24 makes contact with the solder ball through a bottom face 24b and side face 24s of the surface pad portion 24. That is, the contact area is larger than a case where it contacts through only the bottom face like a pad of conventional technology (comparative embodiment 1-1) described later. Consequently, the bonding strength between the surface pad portion 24 and the solder ball 30 can be increased more than the conventional solder pad structure by reducing stress per unit area applied to a joint portion between the surface pad portion 24 and the solder ball 30. Durability against drop of the joint portion between the electrode pad 20 and the solder ball 30 is possibly obtained by intensifying the bonding strength.

Further, because according to the embodiment 1-1, the solder pad 20 is formed on the through hole 16, it comes that a conductive portion extends in the Z-axis direction and thus, stress can be relaxed by the solder pad 20 and the through hole 16, thereby making it more difficult for the bonding strength between the solder pad 20 and the solder ball 30 to drop. Further, because the stress by drop can be buffered by the conductive portion of the through hole, the drop impact resistance at the joint portion between the solder pad 20 and the solder ball 30 can be obtained.

Because according to the embodiment 1-1, the corner between the bottom face 24b and the side face 24s of the surface pad portion is chamfered into a round face, that is, the side face 24s of the surface pad portion is in a circular shape defined by 90°, no stress is concentrated to the vicinity of the corner of the pad so that the stress applied to the surface pad portion is equalized. Thus, the bonding strength of solder with respect to the side face 24s and the bottom face 24b of the surface pad is blocked from dropping, so that a crack or the like becomes unlikely to occur around the solder pad.

Further, because stress is unlikely to be concentrated to the vicinity of the corner, stress by drop is not concentrated locally either, so that any fault such as a crack is unlikely to occur. The drop impact resistance at the joint portion between the solder pad and the solder is hard to drop.

FIG. 6(A) indicates a modification of the embodiment 1-1. According to this modification, the solder pad 20 is provided off the through hole 16. However, the through hole 16 is disposed inside a perpendicular line of the outer edge 24e of the solder pad 20. This modification can relax stress with the solder pad 20 and through hole 16 like the embodiment 1-1 whereby making it difficult for the bonding strength between the solder pad 20 and the solder ball 30 to drop.

Embodiment 1-2

FIG. 6(B) is a diagram showing the solder pad 20 of the board mounting for IC chip according to the embodiment 1-2 in enlargement. Although according to the embodiment 1-2, the through hole 16 is not disposed just below the solder pad 20, the other matter is the same as the embodiment 1-1. That is, in this solder pad structure, the surface pad portion 24 is constructed in a larger diameter than the column-like portion 22 and the surface pad 24 is so constructed that the corner between the bottom face 24b and the side face 24s is chamfered into a round face.

Embodiment 1-3

FIG. 7(A) is a diagram showing the solder pad of the IC chip mount substrate according to the embodiment 1-3 in enlargement. According to the embodiment 1-3, the corner of the surface pad 24 is at right angle and the other matters are the same as the embodiment 1-1. That is, the surface pad 24 is constituted in a larger diameter than the column-like portion 22 and the corner between the bottom face 24b and the side face 24s of the surface pad 24 is at right angle and the through hole 16 is disposed just below the solder pad 20.

Embodiment 1-4

FIG. 7(B) is a diagram showing the solder pad of the board mounting for IC chip according to the embodiment 1-4 in enlargement. According to the embodiment 1-4, the corner of the surface pad 24 is at right angle and the other matters are the same as the embodiment 1-2. That is, the surface pad 24 is constituted in a larger diameter than the column-like portion 22 and the corner between the bottom face 24b and the side face 24s of the surface pad 24 is at right angle and the through hole 16 is not disposed just below the solder pad 20.

Embodiment 1-5

FIG. 8(A) is a diagram showing the solder pad 20 of the board mounting for IC chip according to the embodiment 1-5 in enlargement. According to the embodiment 1-5, the corner of the surface pad 24 is chamfered and the other matters are the same as the embodiment 1-1. That is, as for the solder pad structure, the surface pad portion 24 is constituted in a larger diameter than the column-like portion 22 and the corner between the bottom face 24b and the side face 24s of the surface pad 24 is chamfered and the through hole 16 is disposed just below the solder pad 20.

Embodiment 1-6

FIG. 8(B) is a diagram showing the solder pad 20 of the board mounting for IC chip according to the embodiment 1-6 in enlargement. According to the embodiment 1-6, the corner of the surface pad 24 is chamfered and the other matters are the same as the embodiment 1-2. That is, as for the solder pad structure, the surface pad portion 24 is constituted in a larger diameter than the column-like portion 22 and the corner between the bottom face 24b and the side face 24s of the surface pad 24 is chamfered and the through hole 16 is not disposed just below the solder pad 20.

Figure 9:
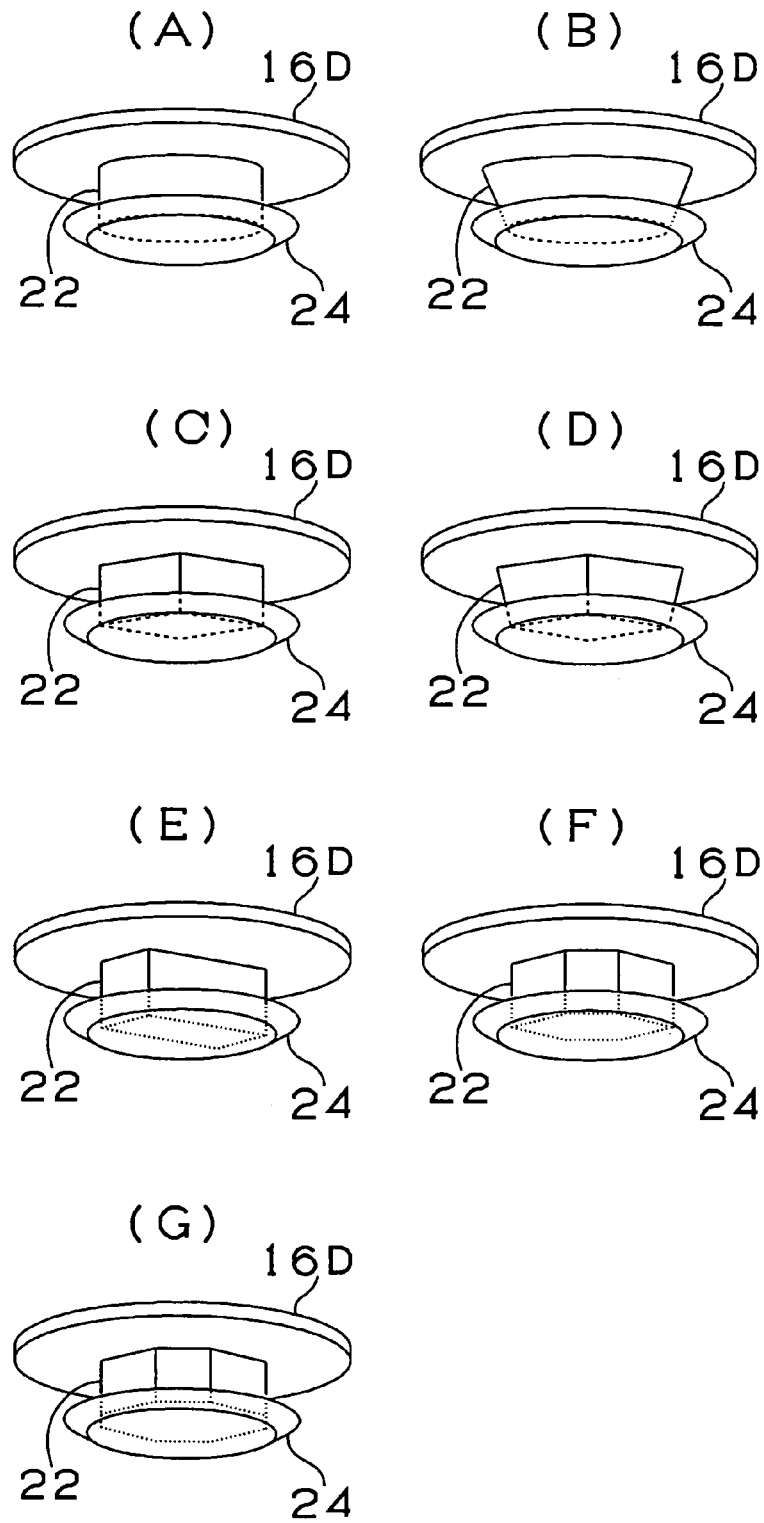
FIG. 9(A) is a perspective view of an electrode pad according to the embodiment 1-1.
FIG. 9(B) is a perspective view of an electrode pad according to another embodiment of the embodiment 1-1.
FIG. 9(C) is a perspective view of an electrode pad according to the embodiment 1-7.
FIG. 9(D) is a perspective view of an electrode pad according to another embodiment of the embodiment 1-7.
FIG. 9(E) is a perspective view of an electrode pad according to the embodiment 1-8.
FIG. 9(F) is a perspective view of an electrode pad according to the embodiment 1-9.
FIG. 9(G) is a perspective view of an electrode according to the embodiment 1-10.

Although according to the embodiments 1-1 to 1-6, the column-like portion is cylindrical as shown in FIG. 9(A), the column-like portion 22 may be formed into a conical shape with a head as shown in FIG. 9(B).

Embodiment 1-7

The embodiment 1-7 is the same as the embodiment 1-1 except that the shape of the column-like portion 22 is square as shown in FIG. 9(C). In the meantime, the column-like portion of the embodiment 1-7 may be formed into a pyramid with a head as shown in FIG. 9(D).

Embodiment 1-8

The embodiment 1-8 is the same as the embodiment 1-1 except that the shape of the column-like portion 22 is rectangular as shown in FIG. 9(E).

Embodiment 1-9

The embodiment 1-9 is the same as the embodiment 1-1 except that the shape of the column-like portion 22 is polygonal prism (hexagon) as shown in FIG. 9(F).

Embodiment 1-10

The embodiment 1-10 is the same as the embodiment 1-1 except that the shape of the column-like portion 22 is polygonal prism (octagon) as shown in FIG. 9(G).

Comparative Embodiment 1-1

According to the comparative embodiment 1-1, as the solder pad 20 of the embodiment 1, land 16D of a through hole 16 based on the conventional art is used as a pad as shown in FIG. 18(A) and the solder ball 30 is connected directly to the land 16D.

Comparative Embodiment 1-2

According to the comparative embodiment 1-2, a solder pad 28 is provided on the land 16D as shown in FIG. 18(B).

A result of simulation of the embodiment 1-1, the comparative embodiment 1-1 and the comparative embodiment 1-2 will be described. Here, calculation is carried out with a load of 10N applied to the solder ball 30 as shown in FIG. 10(A) showing the embodiment 1-1, FIG. 10(B) showing the comparative embodiment 1-1 and FIG. 10(C) showing the comparative embodiment 1-2.

In the meantime, needless to say, the solder mentioned in the above embodiment designates not only tin-lead solder but also a variety of low melting point alloys free of lead.

Referring to FIG. 10(A), a point having the highest stress (peak point PP) on the electrode pad 20 of the embodiment 1 is a central position of the bottom portion of the pad portion 24 and that stress was 727 MPa.

Referring to FIG. 10(B), a point having the highest stress (peak point PP) of the comparative embodiment 1-1 is an outermost edge in which the land 16D and the solder ball 30 make contact with each other and that stress was 980 MPa.

Referring to FIG. 10(C), a point having the highest stress (peak point PP) of the comparative embodiment 1-2 is an outermost edge in which the land 16D and the solder ball 30 make contact with each other and that stress was 856 MPa.

From the above simulation result, it was made evident that the electrode pad 20 of the embodiment 1 had a lower stress and a lower likelihood of reduction in bonding strength than the comparative embodiment 1-1 (conventional art, FIG. 10(B)), and the comparative embodiment 1-2 (FIG. 10(C)) even at its portion in which the stress reached the highest point.

To analyze a bonding structure between the solder pad and solder ball, calculation was carried out by simulation about the following cases: a case where the side face 20s of the surface pad 20 makes contact with the solder ball 30 as shown in FIG. 11(A), a case where the side face 20s of the surface pad 20 is not in contact with the solder ball 30 while the diameter of a contact portion (top portion) of the solder ball 30 is equal to the diameter of the pad 20 as shown in FIG. 11(B) and a case where the side face 20s of the pad 20 is not in contact with the solder ball 30 while the diameter of the pad 20 is larger than the contact portion (top portion) of the solder ball 30 as shown in FIG. 11(C).

In the case shown in FIG. 11(A), the point having the highest stress (peak point PP) was a central position of the bottom portion of the pad 20 and its value was 640 MPa while a point having the lowest stress was 320 MPa and an average value was 392 MPa.

In the case shown in FIG. 11(B), a point having the highest stress (peak point PP) was a central position of the bottom portion of the pad 20 like FIG. 11(A) and its value was 780 MPa and a point having the lowest stress was 359 MPa and an average value was 414 MPa.

In the case shown in FIG. 11(C), a point having the highest stress (peak point PP) was an outer edge portion 20c in which the pad 20 and solder ball 30 make contact with each other and its stress value was 1150 MPa. A point having the lowest stress was 332 MPa and an average value was 396 MPa.

If comparing the case of FIG. 11(B) with the case of FIG. 11(C), the value of the highest stress is considerably lower in FIG. 11(B). This reason is that in the case shown in FIG. 11(B), the outer edge 20e of the pad 20 is displaced by 0.25 μm downward so as to relax a stress at that position. Contrary to this, in the case shown in FIG. 11(C), a position in which the pad 20 was hard to deform (outer edge portion 20c) had the highest stress so that the outer edge portion 20c was displaced only by 0.12 μm. That is, in the conventional structure shown in FIG. 11(B), it is estimated that the highest stress is increased because a position having the highest stress of the pad is hard to deform.

Figure 12:
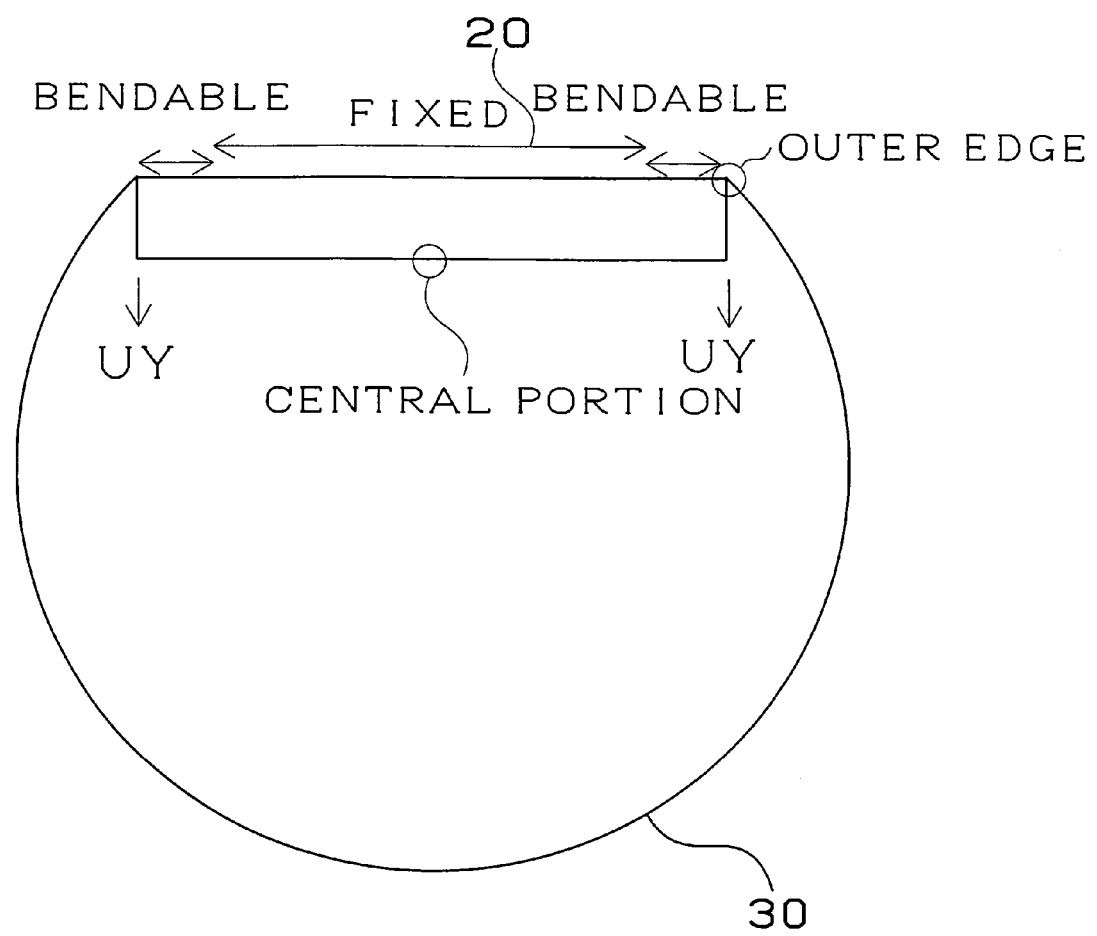
FIG. 12 is a schematic diagram showing a simulation model used for stress analysis.

FIG. 13(A) shows a result of simulation about distortion of an outer edge, stress of the central portion and stress on an outer edge by changing a ratio between the central held portion and a distortion possible portion on the outer edge from 82 to 78 in the structure shown in FIG. 11(A) as shown in FIG. 12 in order to investigate a relation between distortion on the outer edge of a pad and stress. 82% fixed mentioned here means that 82% of the central portion is fixed while 18% is bendable.

From a result of this simulation, it is evident that the stress on a solder end portion (outer edge portion) changes largely with a slight increase of the distortion amount. On the other hand, evidently, stress of the solder central portion does not change so much corresponding to an increase in the distortion amount. From this result also, it is evident that the stress can be decreased with the structure of the embodiment 1.

Subsequently, a result of simulation carried out to search for an optimum size of the electrode pad of the embodiment 1 will be described.

Figure 14:
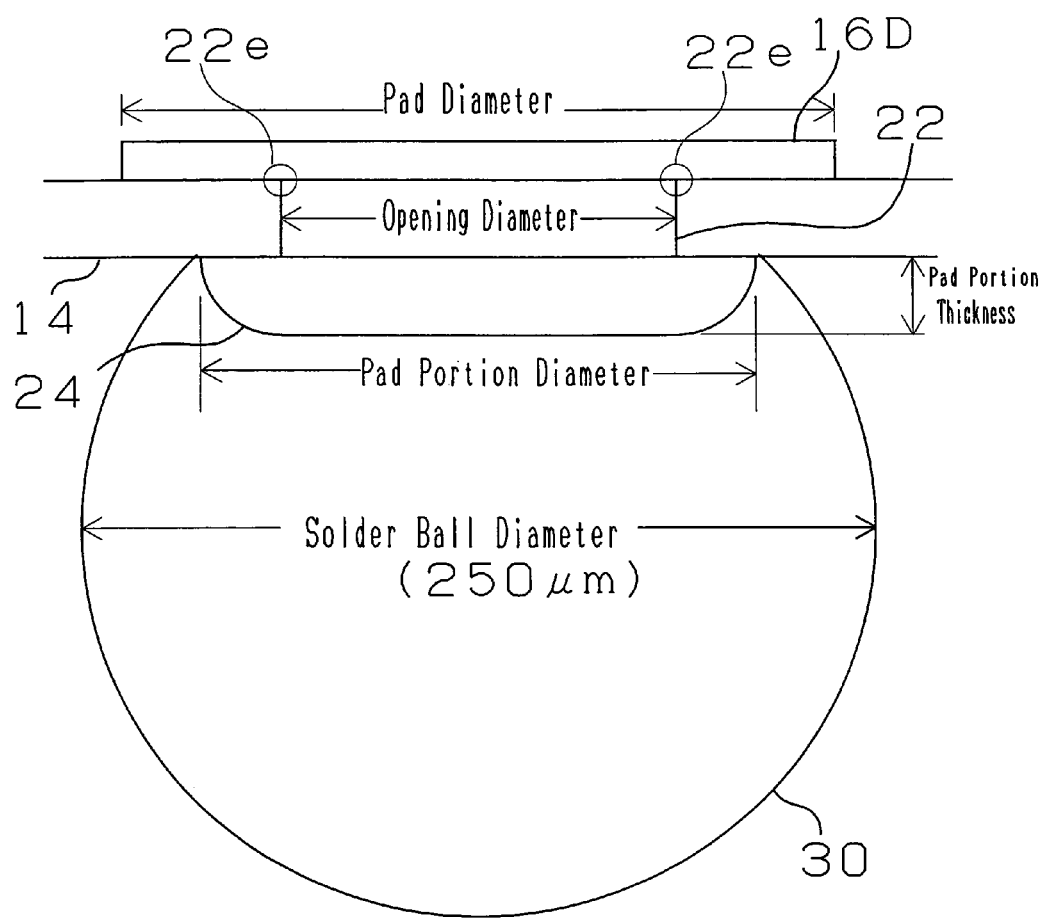
FIG. 14 is a schematic diagram showing a simulation model used for stress analysis.

As shown in FIG. 14, the pad diameter (diameter of land 16D of a through hole) of an electrode pad, an opening diameter of solder resist, a pad portion diameter and pad portion thickness (R) were set as shown in FIG. 13(B) and then, simulations were carried out about No. 1, No. 2, No. 3, No. 4 and No. 5.

As a result of changing the opening diameter of the solder resist about No. 1, No. 2 and No. 3, the measured stress was 558 MPa at the pad central portion of No. 1 (opening diameter; 120 μm), 661 MPa at the pad central portion of No. 2 (opening diameter: 130 μm) and 727 MPa at the pad central portion of No. 3 (opening diameter: 140 μm). From this result, it was made evident that if the opening diameter of the solder resist was increased, the contact area with solder was increased thereby dropping stress on an interface because the diameter of the pad was increased.

Stress on an outer edge portion 22e of the column portion 22 indicated in FIG. 14 was simulated from viewpoints of preventing a peeling between the electrode pad 20 and the through hole 16. As a result, No. 3 (pad portion thickness: 30 μm) provided 2247 MPa, No. 4 (pad portion thickness: 20 μm) provided 2858 MPa and No. 5 (pad portion thickness: 40 μm) provided 2779 MPa. That is, it was found that when the thickness of the pad portion was 30 μm, the stress could be minimized and the thickness of the pad portion was preferred to be in a range of 20-40 μm.

Hereinafter, a result of drop test and reliability test carried out for printed wiring boards of the embodiment 1-1 to embodiment 1-9, comparative embodiment 1-1 and comparative embodiment 1-2 will be described with reference to Table shown in FIG. 16.

(Drop Test)

As shown in FIG. 15(A), package boards 10 of the embodiment 1-1 to 1-10, the comparative embodiment 1-1, the comparative embodiment 1-2 were loaded on a daughter board 60 and each of them was incorporated in a case 98 and then fixed with screws. As shown in FIG. 15(B), the fixed case 98 was dropped naturally from a height of 1 m with its vertical side (head wall up, bottom wall down) down. After the drop test, whether or not an electric connection was secured was checked for each embodiment.

Frequency of drop tests: 10 times, 20 times, 30 times.

If drop tests of 10 times are cleared, drop impact resistance can be obtained as compared with a conventional product (comparative embodiment 1-1) and the embodiment 1-1 to the embodiment 1-10 could clear this. On the other hand, clearing the drop tests of 30 times indicates a high drop impact resistance and the embodiment 1-1 to the embodiment 1-10 could clear the drop tests of 30 times except the embodiment 1-4.

(Reliability Test)

Three sheets of package boards created according to the embodiment 1-1 to 1-10, the comparative embodiment 1-1 and the comparative embodiment 1-2 were subjected to heat cycle condition (135° C./3 min to −55° C./3 min. as a cycle) 1000 cycles, 2000 cycles, 3000 cycles and after that, electric conductivity was checked.

Evaluation: no problem in conductivity: ○
conductivity failure in 1-2 sheets: Δ
conductivity failure in all sheets: X No special problem occurred on usage of products when they are used ordinarily if reliability test of more than 1000 cycles was cleared. Clearing the reliability test of more than 3000 cycles certifies that reliability is secured in a long period. Although the reliability test of 1000 cycles sometimes cannot be cleared in the comparative embodiment 1-1 and the comparative embodiment 1-2, the reliability test of 2000 cycles could be cleared according to the embodiment. Further, the embodiment 1-1, the embodiment 1-8, the embodiment 1-9 and the embodiment 1-10 could clear 3000 cycles test it was made evident that reliability was easy to secure by providing a through hole just below the solder pad.

Second Embodiment

FIG. 17(A) shows the structure of an electrode pad 20 according to the second embodiment. According to the second embodiment, an end portion of the pad portion 24 is semi-circular. Even with this structure, the joint strength between the electrode pad 20 and the solder ball 30 can be intensified like the embodiment 1.

Third Embodiment

FIG. 17(B) shows the structure of the electrode pad 20 according to the third embodiment. According to the fourth embodiment, the pad portion 24 has a smaller diameter than the column portion 22. Even with this structure, the joint strength between the electrode pad 20 and the solder ball 30 can be intensified.

Fourth Embodiment

FIG. 17(D) shows the structure of the electrode pad 20 according to the fourth embodiment. According to the fourth embodiment, the solder ball 30 is mounted on the bottom face 24b of the pad portion 24. Even with this structure, the joint strength between the electrode pad 20 and the solder ball 30 can be intensified.

Although the invention has been disclosed in the context of a certain preferred embodiments, it will be understood that the present invention extends beyond the specifically disclosed embodiments to other alternative embodiments of the invention. Thus, it is intended that the scope of the invention should not be limited by the disclosed embodiments but should be determined by reference to the claims that follow.

What is claimed is:

1. A printed wiring board comprising:
a plurality of solder pads, each of the solder pads having a surface pad portion and a column portion supporting the surface pad portion,
wherein the surface pad portion has an outer edge portion extending sideway from the column portion and configured to bend when a stress is applied, the surface pad portion has a side face in the outer edge portion and a bottom face and is configured to receive solder for mounting an electronic part or an outside board such that the solder is loaded on the side face and bottom face of the surface pad portion, and the surface pad portion being constituted in a diameter larger than the column portion.

2. The printed wiring board according to claim 1, further comprising a substrate having at least one through hole, wherein at least one of the solder pads is formed on the at least one through hole.

3. The printed wiring board according to claim 1, wherein the surface pad portion has corners between the bottom face and the side face which are chamfered into a round face.

4. The printed wiring board according to claim 1, wherein the side face of the surface pad portion is formed in a section of a circular shape defined by 90°.

5. The printed wiring board according to claim 1, wherein the column portion is one of cylindrical, cylindrical with inside vacancy, square, rectangular, and polygonal.

6. The printed wiring board according to claim 1, further comprising:
a substrate; and
a plurality of through holes formed through the substrate, wherein the solder pads are formed on the through holes, respectively.

7. The printed wiring board according to claim 6, wherein the plurality of through holes is formed by plating.

8. The printed wiring board according to claim 1, further comprising:
a substrate;
a plurality of through holes formed through the substrate; and
a solder resist layer formed over the substrate,
wherein the column portion of each of the solder pads is formed through the solder resist layer, the surface pad portion of each of the solder pads is formed over the solder resist layer, and the solder pads are formed on the through holes, respectively.

9. The printed wiring board according to claim 8, wherein the plurality of through holes is formed by plating.

10. A manufacturing method of printed wiring board having a solder pad loaded with solder for mounting an electronic part or an outside board comprising:
forming a printed wiring board having a conductor circuit; and
forming at least one solder pad having a surface pad portion and a column portion supporting the surface pad portion on the conductor circuit, the surface pad portion having an outer edge portion extending sideway from the column portion and being configured to bend when a stress is applied, the surface pad portion having a side face in the outer edge portion and a bottom face and being configured to receive solder for mounting an electronic part or an outside board such that the solder is loaded on the side face and bottom face of the surface pad portion, the surface pad portion being constituted in a diameter larger than the column portion.

11. The manufacturing method of printed wiring board according to claim 10, wherein the forming of the at least one solder pad comprises forming a round face on the pad portion.

12. The manufacturing method of printed wiring board according to claim 10, wherein the forming of the at least one solder pad comprises forming a resin layer the printed wiring board having the conductor circuit, forming an opening through the resin layer by exposure/development or laser beam, and forming the column portion of the solder pad within the opening.

13. The manufacturing method of printed wiring board according to claim 10, wherein the forming of the printed wiring board comprises forming a through hole, and the forming of the at least one solder pad comprises forming the column portion of the solder pad on the through hole.

14. The manufacturing method of printed wiring board according to claim 10, wherein the forming of the printed circuit board comprises forming at least one through hole connecting through a substrate, and the forming of the at least one solder pad comprises forming the at least one solder pad on the at least one through hole.

15. The manufacturing method of printed wiring board according to claim 14, wherein the forming of the at least one through hole comprises plating.

16. The manufacturing method of printed wiring board according to claim 10, wherein the forming of the printed circuit board comprises forming at least one through hole connecting through a substrate and forming a solder resist layer over the substrate, and the forming of the at least one solder pad comprises forming the column portion of the solder pad through the solder resist layer and the surface pad portion of the solder pad over the solder resist layer.

17. The manufacturing method of printed wiring board according to claim 16, wherein the forming of the at least one through hole comprises plating.

* * * * *